United States Patent [19]

Funke et al.

[11] Patent Number: 4,534,044
[45] Date of Patent: Aug. 6, 1985

[54] DISKETTE READ DATA RECOVERY SYSTEM

[75] Inventors: Michael J. Funke, Westford, Mass.; Douglas A. Topliffe, Nashua, N.H.; Donald J. Rathbun, Andover, Mass.

[73] Assignee: Honeywell Information Systems Inc., Waltham, Mass.

[21] Appl. No.: 490,613

[22] Filed: May 2, 1983

[51] Int. Cl.³ .......................... H03L 7/06; G11B 5/09
[52] U.S. Cl. .................................. 375/120; 331/1 A; 360/51
[58] Field of Search .................. 360/51, 77; 369/59; 375/119, 120; 331/1 A; 328/72, 74, 133; 307/262, 511

[56] References Cited

U.S. PATENT DOCUMENTS

| | | | |
|---|---|---|---|
| 4,143,407 | 3/1979 | Liberty | 360/51 |
| 4,390,910 | 6/1983 | Wilson | 360/51 |
| 4,404,530 | 9/1983 | Stryer | 331/1 A |
| 4,464,638 | 8/1984 | Crowley et al. | 331/1 A |

*Primary Examiner*—Benedict V. Safourek
*Attorney, Agent, or Firm*—Nicholas Prasinos

[57] ABSTRACT

A diskette read data recovery system generates a clock which is locked to an incoming data stream. In a phase locked loop, a signal generated by an oscillator and frequency dividers is compared in phase to the incoming data stream to provide first or second signals depending on whether the incoming data signal leads or lags the clock signal. In order that the system may handle different types of incoming signals, different frequency divider circuits in the phase locked loop are selected for different incoming signals.

8 Claims, 9 Drawing Figures

BLOCK DIAGRAM- DUAL SPEED PLL

TIMING DIAGRAM— CLOCK LEADS DATA

TIMING DIAGRAM— CLOCK LAGS DATA

BLOCK DIAGRAM—
DUAL SPEED PLL

DISKETTE READ DATA RECOVERY SYSTEM

BACKGROUND OF THE INVENTION

1. Field of the Invention

This invention relates generally to computer timing systems and more particularly to a phase lock oscillator for generating clock pulses which are locked to an incoming data stream.

2. Description of the Prior Art

There are two major types of read data recovery systems in use as follows:
1. all digital; and
2. phase-locked loop 'PLL'.

In all digital recovery systems the ROM and various registers and counters are utilized to generate the clock from the data stream. This system has the advantage that no adjustments are required during manufacturing. However, the system can only tolerate changes in frequency of approximately ±1% or ±2%. This deficiency places a severe constraint on system design particularly with floppy disk drives of the five and one-quarter inch type since speed variations in excess of 1% and 2% are frequently encountered.

The phase lock loop type of read data recovery system however has the advantage that frequency variations of ±5% to ±8% can easily be tolerated. Additionally, the loop parameter design can easily be optimized by varying the filter characteristics. However the PLL has the disadvantage that it requires multiple power supply voltages in various portions of its circuit. For example, ±5 volts is required for the digital portion and a ±12 volts is required for the operational amplifier portion. Furthermore, the PLL requires a potentiometer adjustment during manufacturing to compensate for component tolerances.

What is needed, therefore, is a read recovery data system which can accommodate wide frequency variations and at the same time can be manufactured with fewer components and which utilizes a single voltage power supply.

OBJECTS OF THE INVENTION

It is an object of the invention to provide an improved read data recovery system.

It is another object of the invention to provide an improved read data recovery system utilizing a phase lock loop oscillator.

It is still another object of the invention to provide an improved read data recovery system utilizing a PLL having only one power supply.

It is a further object of the invention to provide an improved read data recovery system which can accommodate a five and one-quarter inch modified frequency modulation (MFM) diskette drive, an eight inch MFM diskette drive and an eight inch FM diskette drive.

These and other objects of the invention become obvious upon a reading of the specification together with the drawings.

SUMMARY OF THE INVENTION

The diskette read recovery system generates a clock which is locked to the incoming data stream and is used by a system controller to identify data bit cells and to separate clock and data pulses. The clock remains synchronized with the incoming data stream regardless of variations in frequency caused by motor speed changes. The phase lock loop is used in the read data recovery system that utilizes only one power supply and can further accommodate a five and one-quarter inch MFM, an eight inch FM, and an eight inch MFM recording techniques.

The diskette read recovery system has a two-speed switching circuit to switch from the five and one-quarter inch MFM (and eight inch FM) case to the eight inch MFM case. Additionally a phase detector circuit is provided which compares the phase of the input data with the phase of the PLL output. There are two outputs from the phase detector; one output indicates the PLL clock leads the data and consequently the loop frequency must be decreased somewhat to compensate for this; another output indicates that the clock lags the data and accordingly the phase detector generates pulses which tend to increase the loop frequency. Thus the read data recovery system can accommodate variations in drive speed.

BRIEF DESCRIPTION OF THE DRAWINGS

The manner in which the apparatus of the present invention is constructed and its mode of operation can best be understood in the light of the following detailed description, together with accompanying drawings, in which.

DESCRIPTION OF A PREFERRED EMBODIMENT

Microcomputer systems utilize a floppy disk system for mass storage. A floppy disk is sometimes known as a diskette. The floppy disk system is either of the eight inch diskette or the five and one-quarter inch diskette type, and may utilize either a frequency modulation (FM) code or a modified frequency modulation (MFM) code. The serial data stream can be partitioned into bit cells, each representing one bit of data. For FM, each cell must contain both a clock and a data pulse for a binary ONE, or only a clock pulse for a binary ZERO. With eight inch FM data, the period of a one bit cell is 4 microseconds. For MFM, each cell contains a data pulse or a clock pulse, or neither a data pulse nor a block pulse. The following rules apply:
1. If the data is a binary ONE, it is represented by a data pulse.
2. If the data is a binary ZERO following a cell that had a data pulse, then no clock pulse is written.
3. If the data is a binary ZERO following a cell that had no data pulse, then a clock pulse is written.

A pulse appearing in the first half of the cell is the clock pulse and the pulse appearing in the last half of the cell is the data pulse. In MFM code, therefore, successive pulses may be 2, 3 or 4 half cells. Each bit cell has a period of 2 microseconds for the eight inch MFM and 4 microseconds for the five and one-quarter inch MFM.

An exception to the above rule 3 occurs when an address mark is written. In that case, the second of two consecutive clock pulses is omitted.

Figure 1:
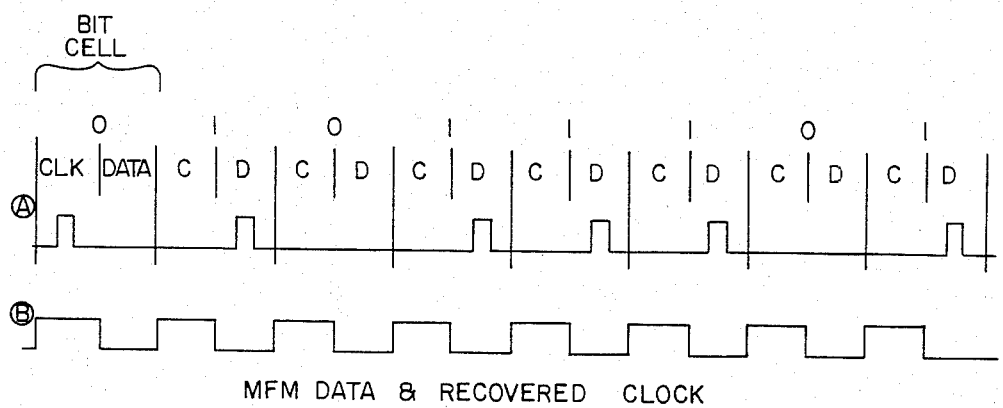
FIG. 1 is a bit stream representation of the hexadecimal data byte (5D) as coded in MFM (modified frequency modulation) format.

To illustrate the MFM code refer to FIG. 1. In FIG. 1, waveform A is the bit stream representation of the hexadecimal data byte (5D) as coded in MFM format. The bit-cell boundaries are shown above the waveform A. Note that each bit cell consists of a clock portion and a data portion, and that each cell contains either a clock pulse (first cell), a data pulse (second cell), or neither a clock nor data pulse (third cell). Waveform B represents the clock output of the corresponding read recovery system output of the phase lock loop. Note that this clock defines the clock and data portions of each bit cell. It should be noted that any peak shift of individual bits is allowed up to the previous and following transition of the clock before a read error occurs.

Figure 2:
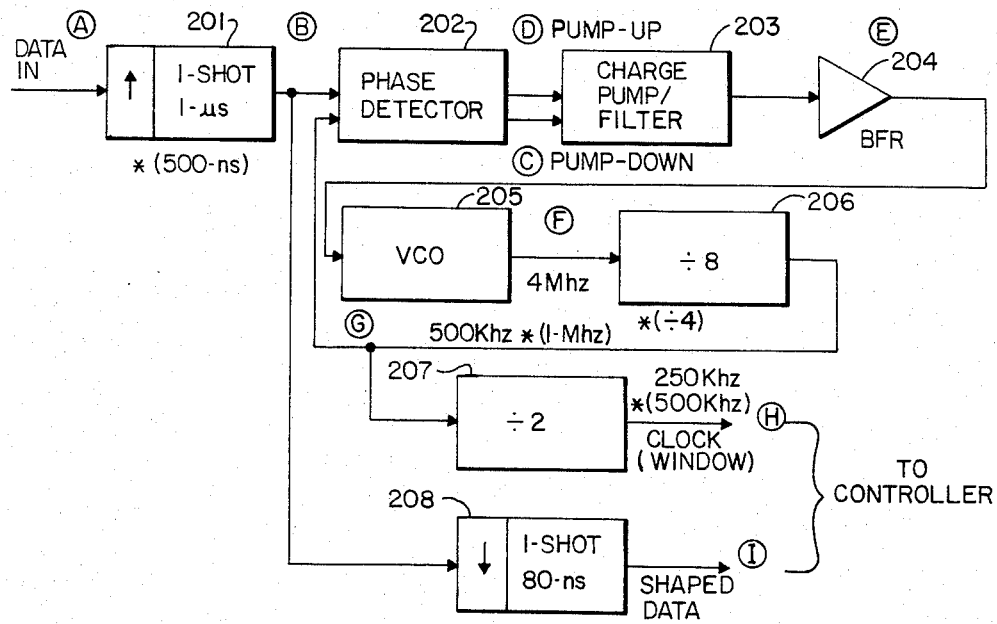
FIG. 2 is a block diagram representation of a single speed phase lock data recovery system.

Referring now to FIG. 2, there is shown a simplified block diagram of the PLL read data recovery system with the two-speed switching circuitry omitted for clarity. To better understand the operation of the invention, FIG. 2 will be discussed together with the timing diagrams of FIGS. 3 and 4, and it should be noted that the capital letters in circles at the various parts of the circuit correspond to the signal at that point as shown by the corresponding capital letter on FIGS. 3 and 4.

Figure 3:
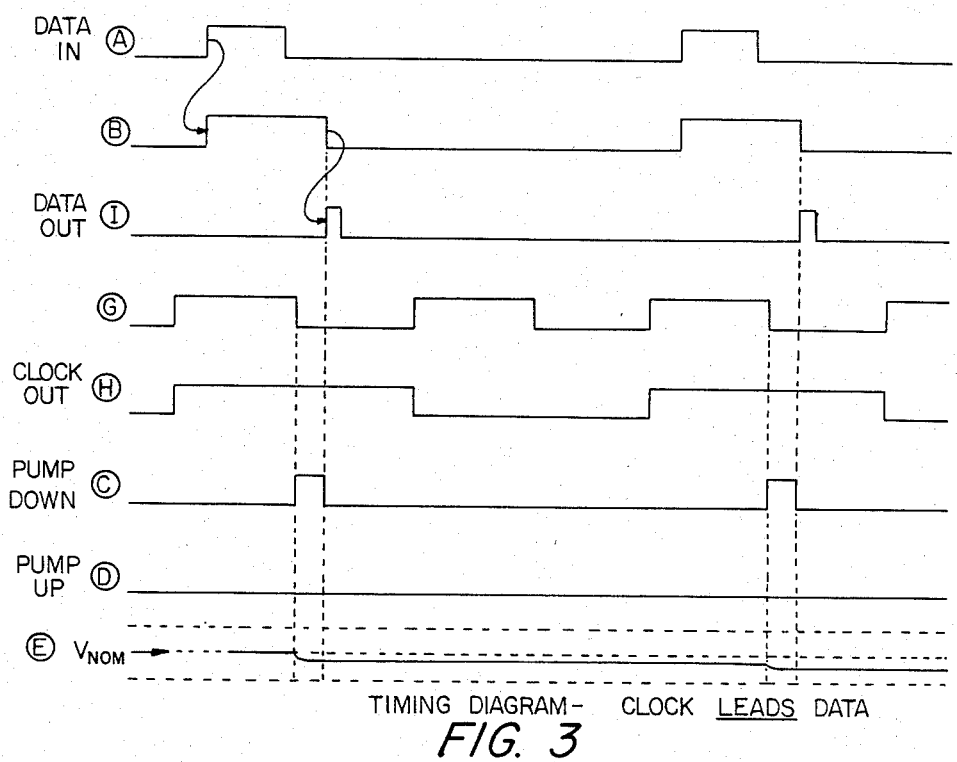
FIG. 3 is a timing diagram for the phase lock oscillator illustrating the clock pulses when the clock leads the data.
Figure 4:
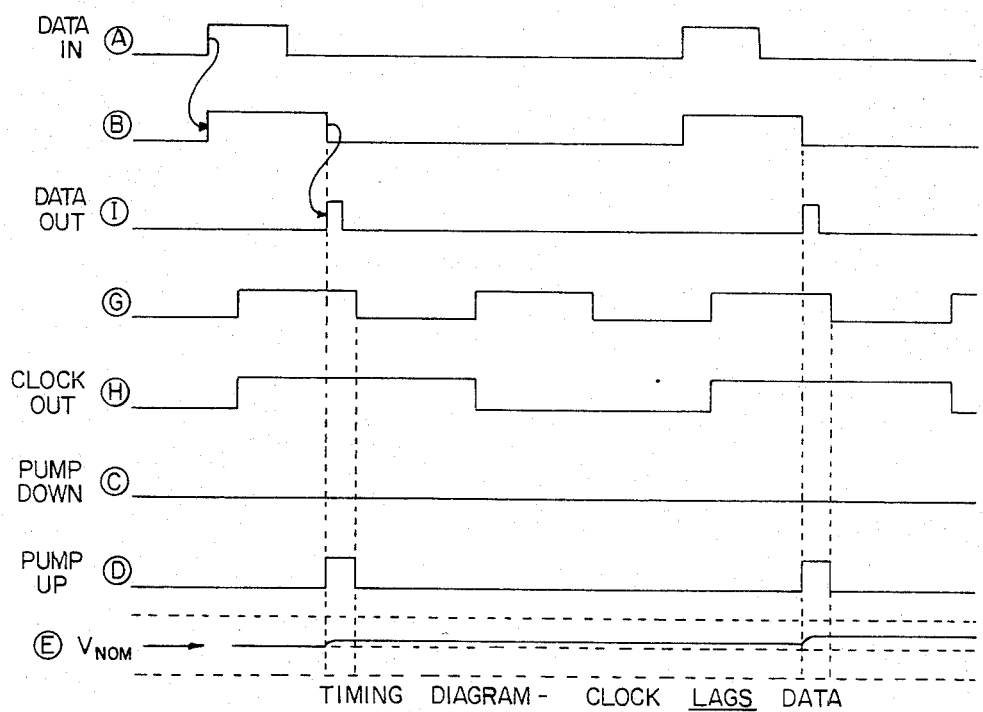
FIG. 4 is a timing diagram for the diskette phase lock read recovery system when the clock lags the data.

Referring now to FIGS. 2, 3 and 4, digitized read data A from the diskette drive is applied to the commercially available 9602 type one microsecond one-shot multivibrator 201. (Elements commercially available from such semiconductor manufactures as Texas Instruments or Motorola are identified by their type number, as well as a reference numeral corresponding to reference numerals in the drawings herein.) The output signal of the one-shot multivibrator 201 is applied to a 74S112 type commercially available JK flip-flop configured as a phase detector 202 and is additionally applied to a 9602 type commercially available 80 nanosecond one-shot multivibrator 208. The output signal Ⓘ of the one-shot 208 is generated by the trailing edge of the Ⓑ pulse as shown on FIG. 3. At phase detector 202 a comparison is made between the phase of the input data signal Ⓐ and that of the output signal Ⓖ of the phase lock loop system. The result of the comparison is generated at one of the two output terminals Ⓒ or Ⓓ of the phase detector 202. These signals indicate whether the clock signal leads or lags the data signal and must be either "pumped-down or pumped-up". If the comparison shows that the clock signal leads the data signal, then the phase detector generates a signal at terminal Ⓒ. On the other hand, if the result of the comparison in the phase detector 202 shows that the clock signal lags the data, a signal is generated at output terminal Ⓓ. When the PLL clock leads the data signal the loop frequency must be decreased to compensate for this. (refer to FIG. 3) When the clock signal lags the data signal the phase detector generates a pulse at Ⓓ which tends to increase the loop frequency. (refer to FIG.4) (Note that the width of pulse Ⓒ in FIG. 3 and pulse Ⓓ of FIG. 4 and hence the amount of correction per pulse is proportional to the amount of lag/lead.) The lead or lag error signal is applied to a charge pump/filter network 203 described in greater detail in FIG. 6. The charge pump circuit is a constant current sink/source which supplies charge or discharge current to a filter network 203A, 203B. The filter network determines the frequency response of the phase lock loop; i.e., the speed at which it can lock on incoming data and the amount of frequency shift it can accommodate and still remain locked. The output signal from charge pump/filter network 203 is applied to an LM358 type commercially available amplifier 204 which acts as a buffer (BFR). The buffer 204 provides a high impedance load to the filter network 203 to prevent loading of the circuit and also provides additional high frequency filtering. The output signal from buffer 204 is applied to a commercially available 74LS629 type voltage control oscillator (VCO) 205. The output signal Ⓔ of the buffer 204 varies with respect to the nominal voltage and "speeds up or slows down" the VCO as required. The VCO is adjusted with no data for a 4 megaHertz output Ⓕ with a nominal ($V_{nom}$) at Ⓔ (FIGS. 3 and 4). As earlier stated, the output from the VCO 205 is compared to the output of the one-shot multivibrator 201 in order to generate an error signal to either "speed up or slow down" the oscillator. However, the output of the voltage controlled oscillator is 4 megaHertz; whereas the output of the one-shot multivibrator 201 is 1 microsecond; therefore in order to properly effect the comparison, a transition is made via divide by 8 counter 206. This permits the VCO 205 to operate at its optimum frequency and yet have the comparison made at the incoming data frequency. In addition to the 500 KHZ signal generated at the output of divide by 8 counter 206, the frequency can be further reduced to a 250 KHZ circuit by dividing by 2 in counter 207. This 250 KHZ signal is used as a clock by the controller to define the bits cells.

The system described supra provides the data recovery for a MFM five and one-quarter inch diskette system. However it is desirable for maximum utility of the diskette read recovery data system to accommodate an eight inch drive in addition to the five and one-quarter inch drive, and further accommodate both modified frequency modulation (MFM) and frequency modulation (FM) recording. To accomplish this, it is necessary to operate the PLL in two distinct modes:

1. Low speed—This mode will handle both the five and one-quarter inch MFM and the eight inch FM cases.
2. High speed—This mode is used only with the eight inch MFM case.

Figure 5:
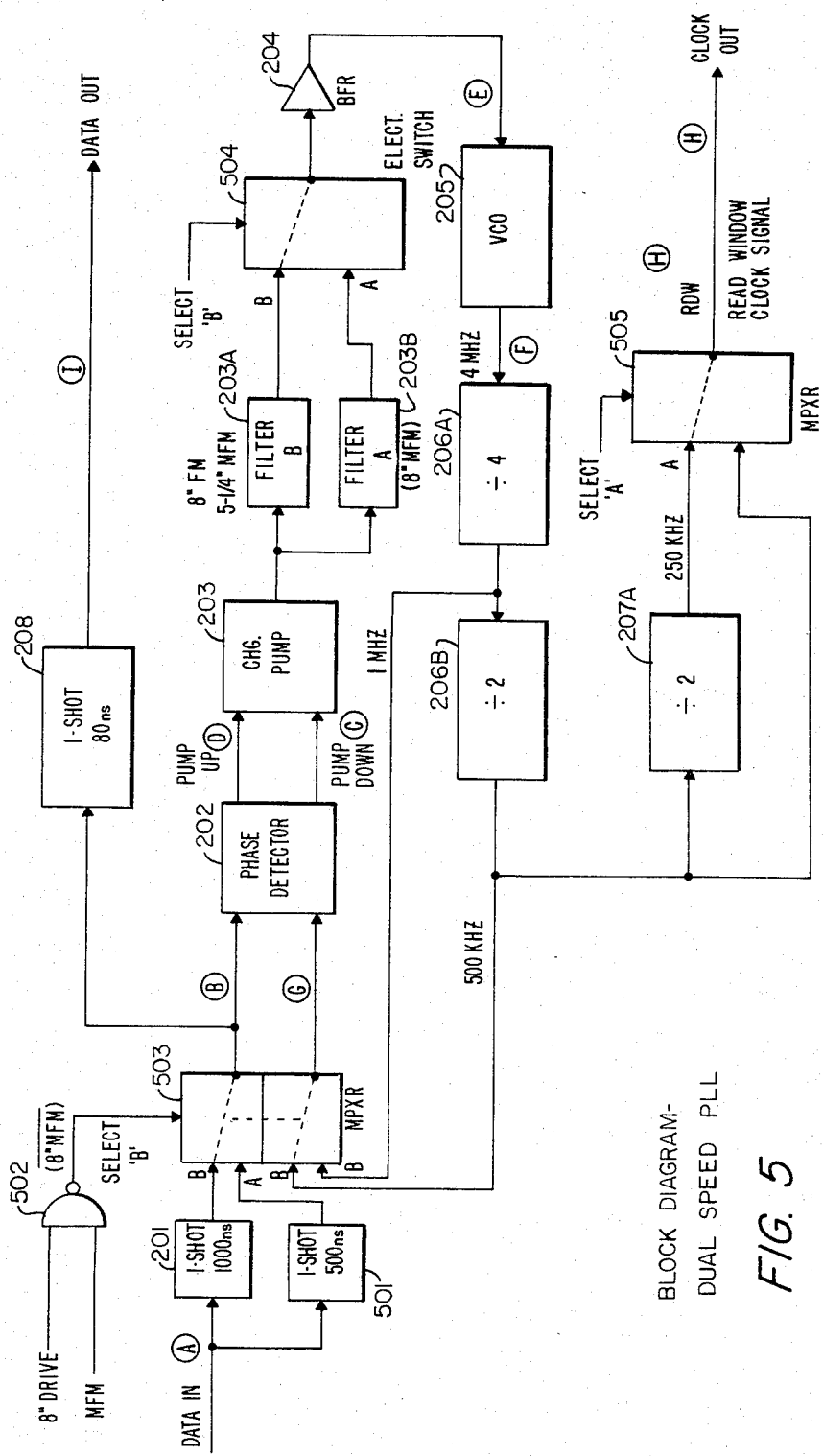
FIG. 5 is a block diagram representation of a dual speed PLL.

This is done by the apparatus shown on FIG. 5.

Referring now to FIG. 5 it will be seen that the majority of the elements are the same as in FIG. 3. The elements 501, 502, 503, 504 and 505 have been added. These elements provide for the switching from one type of diskette drive and recording technique to another. In FIG. 5 the commercially available 74S158 type multiplexer 503 is utilized to select either the low speed or high speed. For low speed a 1000 nanosecond data pulse is used; whereas for high speed a 500 nanosecond signal is used. To select the low speed mode it is necessary that "Select B" signal on FIG. 5 be true on multiplexer 503. This signal is provided by the NAND gate 502. "Select B" signal (low speed mode) will be true unless "eight inch drive" and "MFM" signals are true. Operation from this point on is similar to that described with FIG. 3 with the exception that multiplexers 504 and 505 would select the appropriate filters and divide-by-2 circuitry depending on whether or not "Select Signal" B is present on electronic switch 504 and multiplexer 505.

Referring now to FIGS. 6A-6D, the digitized read data from the floppy disk drive (not shown) is applied to the leading edge trigger inputs of the commercially available 9602 one-shots 602 and 603. An enable signal VCO SYNC is also applied to the reset terminals R of one-shots 602 and 603. Further coupled to the one-shots 602, 603 is an RC network 604, 606, 605, 607 respectively, which determine the pulsewidths. Potentiometers 606A and 606B, coupled to the RC networks 604-606 and 605-607 respectively, are utilized for trimming the pulsewidths of the one-shots 501 and 201 respectively. The ouput signals from 500 nanosecond and 1000 nanosecond one-shots 501 and 201 are applied to the two-speed multiplexer 503. More specifically, the output signal from $\overline{Q}$ terminal of one-shot 602 is applied to the A1 terminal of the commercially available quad two-input multiplexer 608. The output signal from $\overline{Q}$ terminal of one-shot 603 is applied to the B1 terminal of multiplexer 608. The multiplexer 608 selects either the low speed operation or the high speed operation via the select input terminal $\overline{A}/B$ of multiplexer 608. When the input signal applied to the $\overline{A}/B$ terminal is low, the signals on input terminals A1, A2 and A3 of multiplexer 608 are selected and applied to the output terminals $\overline{Y1}$, $\overline{Y2}$ and $\overline{Y3}$ of multiplexer 608.

Conversely when the input signal at terminal $\overline{A}/B$ is high, then the input data signals at terminals B2, B2 and B3 are selected and applied to the output terminals $\overline{Y1}$, $\overline{Y2}$ and $\overline{Y3}$ respectively. The input signals on terminals A1, A2 and A3 respectively are utilized to select the high speed mode; whereas the input terminals B1, B2 and B3 are utilized to select the low speed. The input signals applied to A2 and A3 terminals of multiplexer 608 are derived from the QB and QC terminals of binary counter 600. Similarly the input signals on B2 and B3 input terminals of multiplexer 608 are derived from QC and QD terminals of binary counter 600. As previously noted supra in describing FIGS. 2 and 5, the binary counter represented in those Figures variously by reference numerals 206, 206A, 206B and 207A is utilized to match the frequency of the voltage control oscillator (VCO) 205 to the input data frequency by dividing the frequency by the appropriate quantity, such a divide-by-4, divide-by-8. etc.

The PLL data signals from $\overline{Y1}$ terminal of multiplexer 608 are applied to the clock terminal of flip-flop 613 and the J and R terminals of flip-flop 614, and are further applied to the 80 nanosecond one-shot 208 at a trailing edge trigger input terminal of one-shot 609. The 80 nanosecond one-shot 208 provides data pulses of the proper duration to the controller.

The phase lock loop clock pulses (PLL CLK) Ⓖ from the $\overline{Y2}$ terminal of multiplexer 608 are applied to the J terminal of flip-flop 613 and to the $\overline{CLK}$ terminal of flip-flop 614 of phase detector 202. The $\overline{Y3}$ terminal of multiplexer 608 provides the clock signal to the controller. This signal is shown on FIG. 4 as Window H.

The phase detector 202 compares the data signal (PLL DATA) Ⓑ with a phase lock clock signal (PLL CLK) Ⓖ and provides appropriate pulses Ⓒ or Ⓓ at the $\overline{Q}$ output terminals of flip-flops 613, 614 respectively. These pulses indicate the degree of phase difference between the data signals (PLL DATA) and the phase lock loop clock signal (PLL CLK). (These signals are indicated by Ⓒ and Ⓓ on FIGS. 3, 4, 6B and 6C.)

Referring now to FIG. 3, when the clock Ⓖ lead the data Ⓑ as shown by pump-down Ⓒ and pump-up Ⓓ diagrams, the pump-down signal Ⓒ will be true. This signal is applied to the charge pump 203 at the $\overline{SD}$ terminal. Conversely when the clock lags the data as shown on FIG. 4, the pump-up signal denoted as pump-up Ⓓ is true and will be applied to the $\overline{SU}$ terminal of charge pump 203 on FIG. 6B.

Figure 6A:
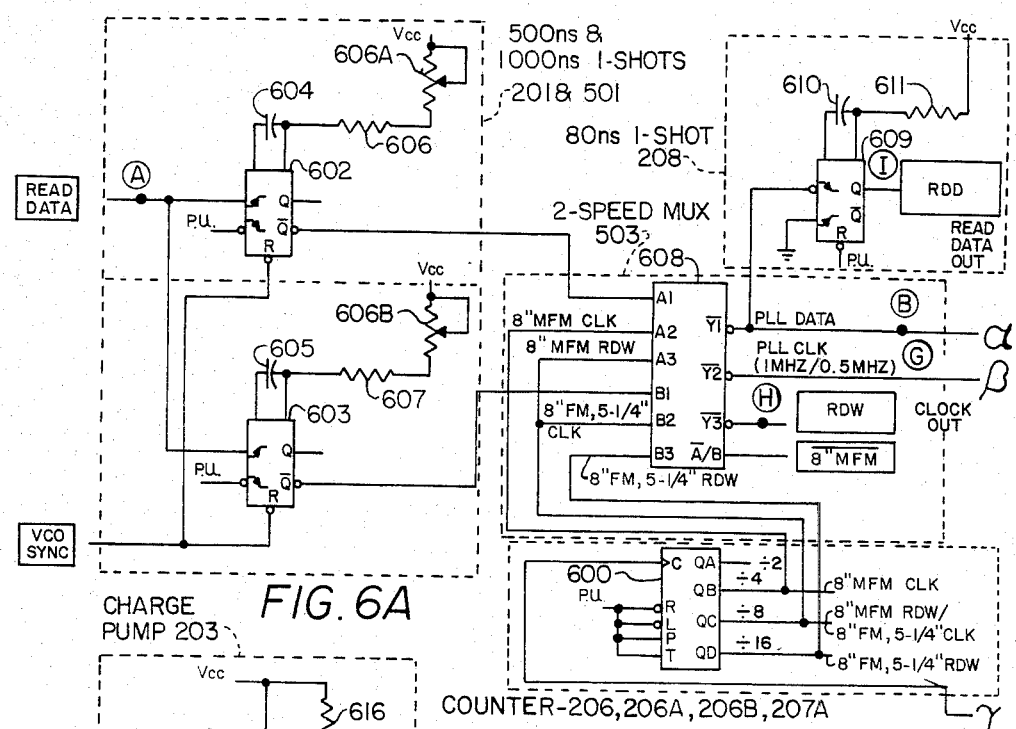
FIGS. 6A-6D are detailed logic block diagrams of the diskette phase lock oscillator read data recovery system.
Figure 6B:
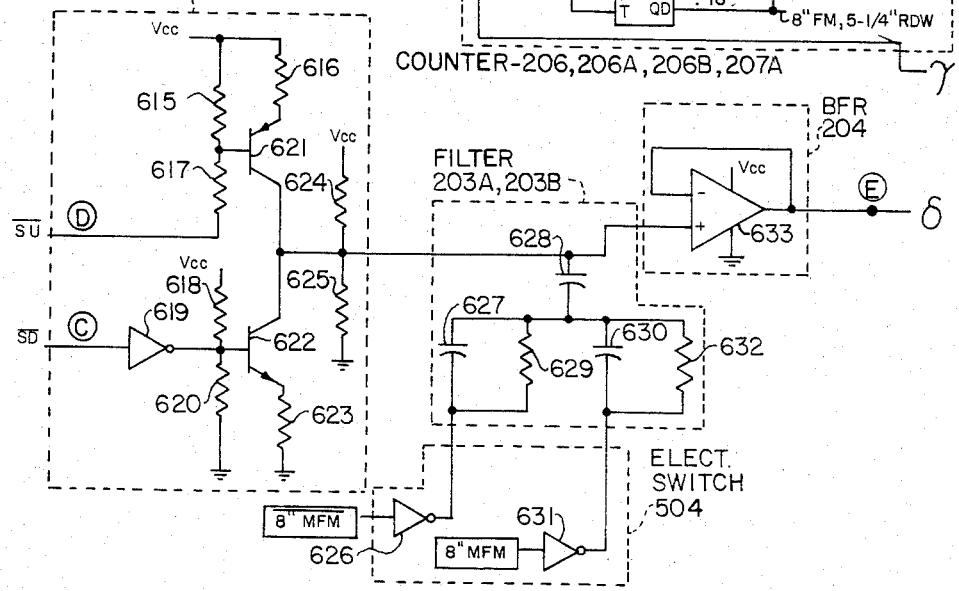
Figure 6C:
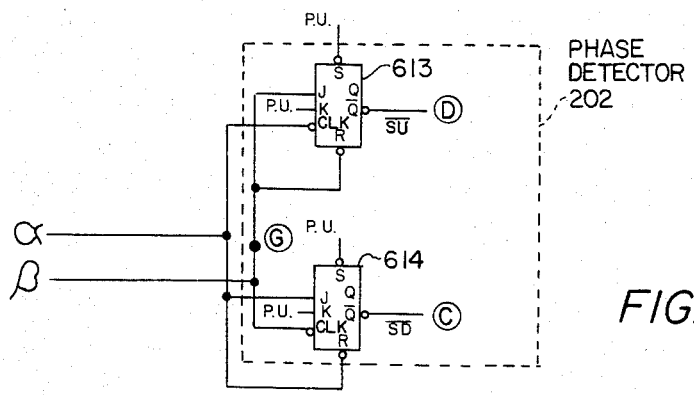
Figure 6D:
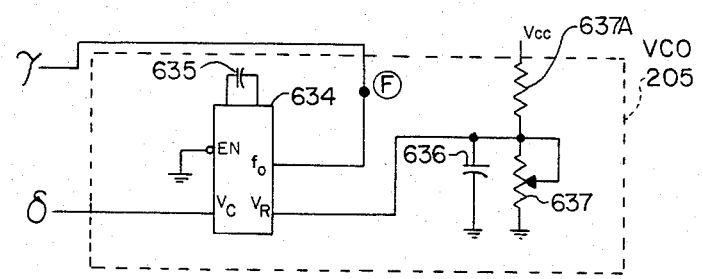

The charge pump 203 is comprised of a network of resistors and transistors and acts as a constant current/source which supplies charge and discharge current to the filter network 203A, 203B. More specifically, the Ⓓ signal from the phase detector 202 is applied to the $\overline{SU}$ terminal coupled to resistor 617. Resistor 617 is coupled to resistors 615, 616 and PNP transistor 621. The Ⓒ signal on terminal $\overline{SD}$ from phase detector 202 is applied first to an inverter 619 and to the junction of resistors 618 and 620. The base of NPN transistor 622 is coupled to the junction point of resistors 618 and 620. The collectors of transistors 621 and 622 are coupled to each other which in turn are coupled to resistors 624 and 625. A buffer (BFR) 204 is coupled to the charge pump 203 at the junction of resistors 624 and 625. The buffer is comprised of a commercially available LM358 operational amplifier 633 and prevents overloading of the filter 203A, 203B and the charge pump 203. The output from the charge pump 203 is also applied to a filter network 203A, 203B via coupling capacitor 628. Filter 203B, shown on FIG. 5, is comprised of capacitor 627 and resistor 629 (FIG. 6B); whereas filter 203A, also shown on FIG. 5, is comprised of capacitor 630 and resistor 632 (FIG. 6B). Filter 203A is selected by the electronic switch whenever the signal eight inch MFM is true (high speed mode). Similarly, filter 203B is selected when eight inch MFM is true (low speed mode). The electronic switch 504 provides a ground via either open-collector inverter 626 or 631 to activate the appropriate filter. The output signal from one of the filter networks 203A or 203B (whichever is selected) is applied to the voltage controlled oscillator (VCO) 205 at the $V_C$ (control voltage) terminal. The $V_R$ (R and O) terminal of the VCO 205 is coupled to an RC network comprises of a fixed resistor 637A and a potentiometer 637 coupled to a capacitor 636 at their junction. The resistors 637A and 637, as well as the capacitor 635, are utilized to determine the center frequency of the VCO; whereas the capacitor 636 is utilized for noise decoupling. The output signal from the $f_0$ terminal of the VCO is applied to the C input terminal of binary counter 600. As previously discussed, the binary counter divides the signal and applies it to the two-speed multiplexer 503.

Table I below provides numerical values for the various elements which are commercially available.

TABLE I

| Reference Numeral | Name of Element | Catalog Type | Value |
|---|---|---|---|
| 602,603,609 | monostable multivibrator or "one-shot" | 9602 | Not applicable |
| 608 | multiplexer | 74S158 | Not applicable |
| 613, 614 | flip-flop | 74S112 | Not applicable |
| 600 | binary counter | 74S161 | Not applicable |
| 619 | inverter | 74S05 | Not applicable |
| 620 | resistor | — | 510 ohms |
| 618 | resistor | — | 1K |
| 617 | resistor | — | 810 ohms |
| 615 | resistor | — | 1K |
| 616 | resistor | — | 2.2K |
| 623 | resistor | — | 1.2K |
| 621 | transistor | 2907 | Not applicable |
| 622 | transistor | 2222 | |

TABLE I-continued

| Reference Numeral | Name of Element | Catalog Type | Value |
|---|---|---|---|
| 624 | resistor | — | 51K |
| 625 | resistor | — | 33K |
| 629 | resistor | — | 1.5K |
| 632 | resistor | — | 1.3K |
| 628 | capacitor | — | 0.033 uf |
| 627 | capacitor | — | 1500 pf |
| 630 | capacitor | — | 820 pf |
| 626, 631 | inverter | 74S05 | |
| 633 | operational amplifier | LM358 | Not applicable |
| 634 | voltage control oscillator | 74LS629 | Not applicable |
| 635 | capacitor | — | 75 pf |
| 636 | capacitor | — | 0.056 uf |
| 637A | resistor | — | 510 ohms |
| 637 | potentiometer | — | 1K |
| 604 | capacitor | — | 120 pf |
| 605 | capacitor | — | 240 pf |
| 606 | resistor | — | 7.5K |
| 606A | potentiometer | — | 10K |
| 606B | potentiometer | — | 10K |
| 607 | resistor | — | 7.5K |

Although only one embodiment of the invention has been shown and described, those skilled in the art will realize that many variations and modifications can be made to produce the described invention and still be within the spirit and scope of the claimed invention. Thus, some of the elements may be altered or replaced by equivalent elements which will provide the same result and fall within the spirit of the claimed invention. It is the intention, therefore, to be limited only as indicated by the scope of all the claims below.

What is claimed is:

1. A read data recovery system for generating a clock which is locked to an incoming data stream comprising:
   (a) a clock means including an oscillator and frequency divider for generating clock signals in synchronism to incoming data signals;
   (b) second means coupled to said clock means for comparing the phase of the clock signals with the phase of the incoming data signals, and including third means for providing a first signal when the phase of the incoming data signal leads the phase of the incoming data signal and further including fourth means for providing a second signal when the phase of incoming data signal lags the phase of the clock signal;
   (c) fifth means coupled to said second means and responsive to said third and fourth means for either increasing or decreasing the frequency of the clock signals; and
   (d) sixth means for selecting and applying to the second means a first frequency divided ouput from the oscillator when the system receives data signals having a first frequency and a second frequency divided output from the oscillator when the system receives data signals having a second frequency.

2. The read recovery data system as recited in claim 1 including seventh means coupled to said clock means and to said second means for determining the frequency response of said clock means and second means.

3. The read recovery data system as recited in claim 2 including eighth means coupled to said second and seventh means for providing a high impedance load to said seventh means and further providing high frequency filtering.

4. The read recovery data system as recited in claim 3 further comprising two monostable multivibrators with one providing a 500 nanosecond pulse and the other providing a 1000 nanosecond pulse for alternatively receiving the incoming data stream and applying a data stream to the second means.

5. The read recovery data system as recited in claim 4 wherein the second means comprises JK flip-flops.

6. The read recovery data system as recited in claim 5 wherein said oscillator is a voltage controlled oscillator.

7. The read data recovery system as recited in claim 1 wherein said sixth means is a multiplexer.

8. A method of synchronizing clock signals and incoming data signals which are up to 8% out of synchonism comprising the steps of:
   (a) generating clock signals;
   (b) comparing the phase of the clock signals with the phase of the incoming data signals;
   (c) providing a first signal when the phase of the incoming data signals leads the phase of the clock signals;
   (d) providing a second signal when the phase of the incoming data signals lags the clock signals;
   (e) increasing or decreasing the frequency of the clock signals in response to the first or second signals respectively; and
   (f) changing the frequency of the clock signals from a first frequency to a second frequency to match a change in frequency of the data signals received.

* * * * *